US 8,468,685 B2

(12) United States Patent
Tanaka et al.

(10) Patent No.: US 8,468,685 B2
(45) Date of Patent: Jun. 25, 2013

(54) WIRE FORMING DEVICE

(75) Inventors: Katsumi Tanaka, Tokyo (JP); Kenichi Shinozaki, Tokyo (JP); Tetsuya Okumura, Tokyo (JP); Makoto Kikuta, Tokyo (JP); Masami Sano, Tokyo (JP); Taro Mogi, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 0 days.

(21) Appl. No.: 13/326,541

(22) Filed: Dec. 15, 2011

(65) Prior Publication Data

US 2012/0151757 A1 Jun. 21, 2012

(30) Foreign Application Priority Data

Dec. 16, 2010 (JP) .................................. 2010-280847

(51) Int. Cl.
*H05K 3/10* (2006.01)
(52) U.S. Cl.
USPC .............. 29/729; 29/564.7; 29/33 K; 72/104; 72/307
(58) Field of Classification Search
USPC .............. 29/729, 739, 745–748, 513; 140/82, 140/92.2, 712
See application file for complete search history.

(56) References Cited

U.S. PATENT DOCUMENTS

| 2,125,573 | A | * | 8/1938 | Kelley, Jr. | 239/353 |
| 2,936,808 | A | * | 5/1960 | Felt | 72/293 |
| 6,233,818 | B1 | * | 5/2001 | Finn et al. | 29/843 |
| 6,665,931 | B2 | * | 12/2003 | Yamaguchi et al. | 29/850 |
| 2012/0151757 | A1 | * | 6/2012 | Tanaka et al. | 29/729 |

FOREIGN PATENT DOCUMENTS

| KR | 10-0575139 B1 | 4/2006 |
| WO | WO-2009-069210 A1 | 6/2009 |

OTHER PUBLICATIONS

Korean Office Action in KR 10-2011-0123798, dated Dec. 20, 2012.

\* cited by examiner

*Primary Examiner* — Minh Trinh
(74) *Attorney, Agent, or Firm* — Bacon & Thomas, PLLC

(57) ABSTRACT

A wire forming device for applying a paste material on an insulating substrate to form a wiring pattern. The wire forming device includes a paste material application unit which includes an atomizing unit atomizing the paste material and a nozzle spraying the atomized paste material onto the insulating substrate. The atomizing unit includes: a medium supplying portion which mixes a medium with a carrier gas to form a mixed gas and an atomizing portion. The atomizing portion holds the paste material and brings the mixed gas into contact with the paste material to atomize the paste material, thereby making a mist stream of the mixed gas and the paste material as the atomized paste material fed to the nozzle. The wire forming further includes a mixing ratio adjusting unit adjusting a mixing ratio of the paste material to the mixed gas in the mist stream.

7 Claims, 4 Drawing Sheets

WIRE FORMING DEVICE

CROSS-REFERENCE TO RELATED APPLICATION

This application claims, under 35 USC 119, priority of Japanese Application No. 2010-280847 filed on Dec. 16, 2010.

BACKGROUND OF THE INVENTION

1. Technical Field Relating to the Invention

The present invention relates to a wire forming device supplying a paste material on an insulating substrate to form a wiring pattern.

2. Description of Related Art

A wire forming device such as an open repair device in a mist jet type performing formation of a wire on a semiconductor chip is generally known. An example of this wire forming device is a wire forming device in Patent Document 1 (International Publication No. WO 2009/069210). This wire forming device will be briefly described below.

The wire forming device mainly includes a purifying atmospheric plasma generating unit removing oxides on an insulating substrate by a chemical reaction with a plasma gas, a paste material attaching unit supplying a paste material on the insulating substrate, and an oxygen radical molecule jetting unit irradiating the paste material supplied on the insulating substrate by the paste material attaching unit with oxygen radical molecules. After the purifying atmospheric plasma generating unit of the wire forming device removes the oxides on the insulating substrate, the paste material attaching unit supplies the paste material on the insulating substrate, and the oxygen radical molecule jetting unit thereafter irradiates the paste material supplied on the insulating substrate with the oxygen radical molecules, to form a wire.

In this wire forming device, the paste material attaching unit is configured as shown in FIG. 1. That is, a paste material attaching unit 1 has an atomizing unit 2, a mist stream converting unit 3, and a nozzle 4.

The atomizing unit 2 mainly includes an atomizing portion 5 and a medium supplying portion 6. The atomizing portion 5 atomizes a paste solvent by ultrasonic oscillation and supplies the mist stream to the mist stream converting unit 3. The medium supplying portion 6 supplies the atomizing portion 5 with a mixed gas in which a carrier gas from a carrier gas source and a gas obtained by atomizing (vaporizing) a medium are mixed.

The mist stream converting unit 3 converts the mist stream of the paste material atomized by the atomizing unit 2 so that the stream diameter may be a predetermined stream diameter and so that the mist stream may be rotated in a spiral. The nozzle 4 jets the mist stream converted in the mist stream converting unit 3 on an insulating substrate.

SUMMARY OF THE INVENTION

Meanwhile, in the aforementioned atomizing unit 2, the medium supplying portion 6 has no temperature regulating function and is kept at a constant temperature by a constant-temperature bath 7. This enables formation of a favorable wire. However, when an ambient temperature changes, or a mixing ratio of the mist stream supplied from the atomizing portion 5 to the mist stream converting unit 3 changes over time, a stable wire cannot be formed.

In the atomizing portion 5, a solution in which a metal nano paste and a diluent are mixed (hereinafter, an applying solution) is atomized by ultrasonic, and the metal nano paste levitated at the time of atomization is supplied to the nozzle 4 by a carrier gas (N2) to apply the metal nano paste. At this time, atomization cannot be done only with the metal nano paste, and a solution excellent in atomizing characteristics needs to be added to the diluent. It is to be noted that the metal nano paste means metal nano particles and a solvent for maintaining a nano state of the metal.

In a case where atomization is performed continuously by ultrasonic oscillation in the aforementioned applying solution, a liquid is evaporated and is easy to decrease. Thus, the aforementioned solution excellent in atomizing characteristics decreases earlier. At first, changes in application line form along with changes in mixing ratio of the applying solution occur, and drawing is disabled relatively in a short period as atomization cannot be performed any more.

Also, when a temperature around the medium supplying portion 6 changes, an inside gas is influenced via a communicating tube or the like to cause the concentration of the carrier gas to be changed, and the amount of the medium to be supplied to the atomizing portion 5 is changed, which causes the mixing ratio at the atomizing portion 5 to be unstable. Consequently, a wiring pattern cannot be formed in a stable manner.

The present invention is accomplished by taking such problems as mentioned above into consideration thereof, and an object thereof is to provide a wire forming device enabling a wiring pattern to be formed in a stable manner.

A wire forming device of an atomizing unit according to the present invention is a wire forming device supplying a paste material on an insulating substrate by a paste material attaching unit to form a wiring pattern. The paste material attaching unit includes an atomizing unit atomizing the paste material and a nozzle spraying the paste material atomized in the atomizing unit on the insulating substrate, and the atomizing unit includes a medium supplying portion mixing a gas obtained by atomizing a medium with a carrier gas and supplying the mixed gas to an atomizing portion, the atomizing portion atomizing a paste solvent, taking it into the mixed gas from the medium supplying portion, and making a mist stream, and a mixing ratio adjusting unit adjusting a mixing ratio of the mist stream.

Since the mixing ratio adjusting unit adjusts the mixing ratio of the mist stream, a stable wire can be formed continuously over a long period.

DESCRIPTION OF THE PREFERRED EMBODIMENTS

Hereinafter, a wire forming device according to an embodiment of the present invention will be described with reference to the attached drawings. A wire forming device is a device to be used to form a wiring pattern or repair a wire missing part by supplying a paste material on an insulating substrate such as a semiconductor chip or a liquid crystal display by an after-mentioned paste material attaching unit. There are various types of wire forming devices such as an open repair device in a mist jet type. In such wire forming devices, changes in mixing ratio of a mist stream jetted from a nozzle cannot be restricted completely, and an application line form is gradually changed. On the other hand, a wire forming device according to the present embodiment is a device enabling the mixing ratio of the mist stream to be adjusted and enabling a stable wire to be formed continuously over a long period.

Since the changes in mixing ratio of the mist stream jetted from the nozzle occur definitely as operating time goes by, application parameters need to be changed in accordance with an application line form. As for the relationship between the application line form and the application parameters, an experiment has clarified that a proportional relation is established between an application line width and a carrier gas flow rate. That is, when the carrier gas flow rate is increased, the application line width is larger. Accordingly, by gradually increasing the carrier gas flow rate to deal with a decrease in application line width over time, the application line width is prevented from being smaller and can be kept constant.

Under such circumstances, in the wire forming device according to the present embodiment, the application line width is determined by image processing, and the carrier gas flow rate is increased as feedback for this, for the purpose of stabilization of the application line form. Also, in addition to the increase of the carrier gas flow rate, adjustment of the mixing ratio of the mist stream enables stabilization of the application line form as well. The wire forming device according to the present embodiment is achieved based on such an idea. Hereinafter, a specific configuration of the wire forming device according to the present embodiment will be described.

Figure 1:
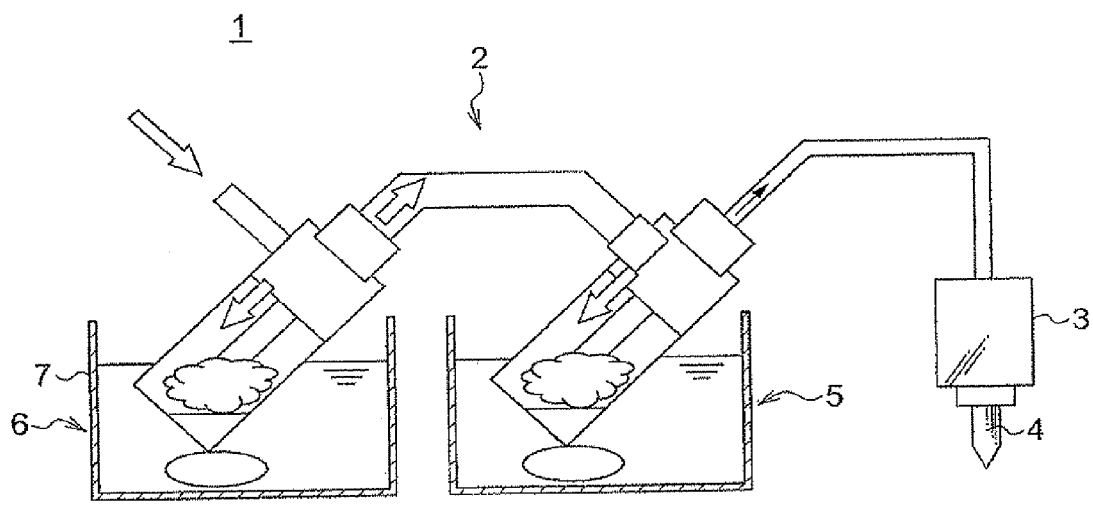
FIG. 1 is a schematic configuration diagram showing a conventional paste material attaching unit.
Figure 2:
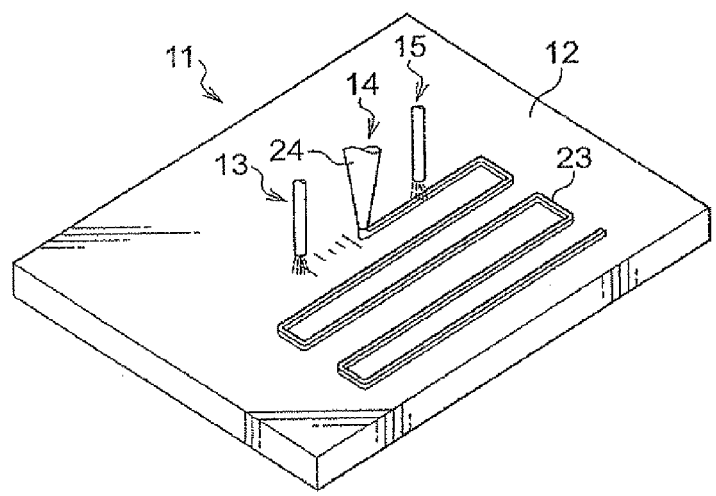
FIG. 2 is a schematic configuration diagram showing a main part of a wire forming device according to an embodiment of the present invention.

A schematic configuration of the wire forming device according to the present embodiment is shown in FIG. 2. That is, a wire forming device 11 includes a zapping processing unit 13 removing oxides on an insulating substrate 12 by zapping processing with laser, a paste material attaching unit 14 supplying a paste material on the insulating substrate 12, and a sintering processing unit 15 sintering and hardening with laser the paste material supplied on the insulating substrate 12 by the paste material attaching unit 14.

The zapping processing unit 13 is a unit for removing oxides that are obstacles when the paste material from the paste material attaching unit 14 is to be attached to the insulating substrate 12. The zapping processing unit 13 emits a laser light and removes oxides on the surface of the insulating substrate 12 by scraping, punching, or cutting them. The zapping processing unit 13 performs zapping processing to a zone to which the paste material is to be applied.

The zapping processing unit 13 can be moved automatically along a desired pattern with use of a known automatic control mechanism (not shown).

In the region on the insulating substrate 12 purified by the zapping processing unit 13, the paste material is sprayed and supplied from a jetting outlet of a nozzle 24 of the paste material attaching unit 14 in FIG. 2. By making the nozzle 24 of the paste material attaching unit 14 follow the zapping processing unit 13, the paste material can be supplied and attached to the purified region on the insulating substrate 12 sequentially in a line form (in a straight or curved line).

As a method for attaching the paste material to the insulating substrate 12, a method of spraying the paste material in a mist state (atomized state) by a nozzle using a similar method to an ink jet method (hereinafter referred to as mist jet) is applied. In the mist jet processing, jet from the nozzle 24 is narrowed so that the mist may go out, e.g., in a spiral to be able to form linear wiring. To render the paste material in a mist state (atomized state), an after-mentioned atomizing unit 31 is applied.

The sintering processing unit 15 is a unit for hardening the paste material applied on the insulating substrate 12 with CW laser to form a wiring pattern 23. The sintering processing unit 15 irradiates and sinters the paste material reliably with use of the CW laser, not pulse laser, to form the wiring pattern 23.

Figure 3:
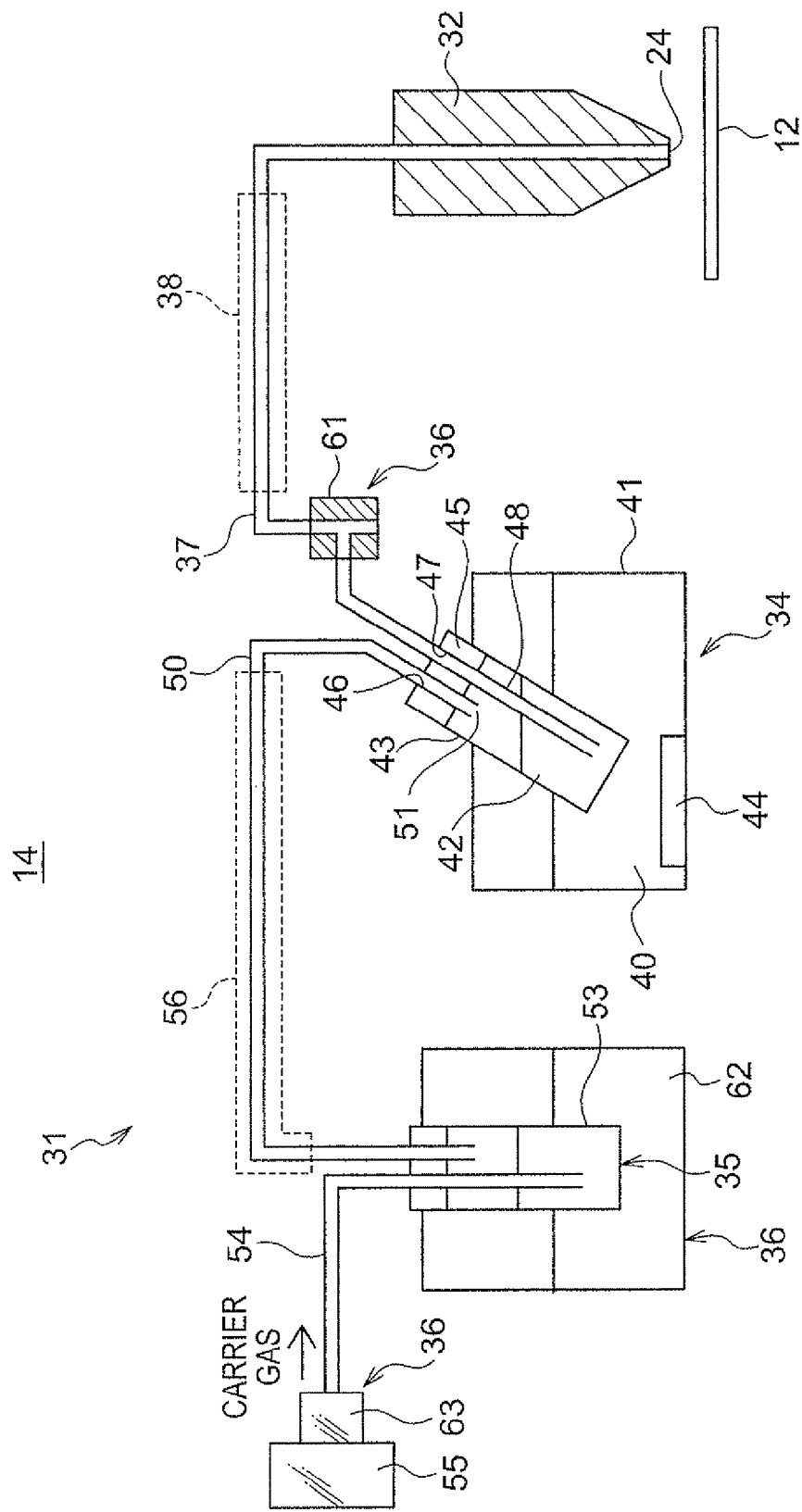
FIG. 3 is a schematic configuration diagram showing a paste material attaching unit according to the embodiment of the present invention.
Figure 4:
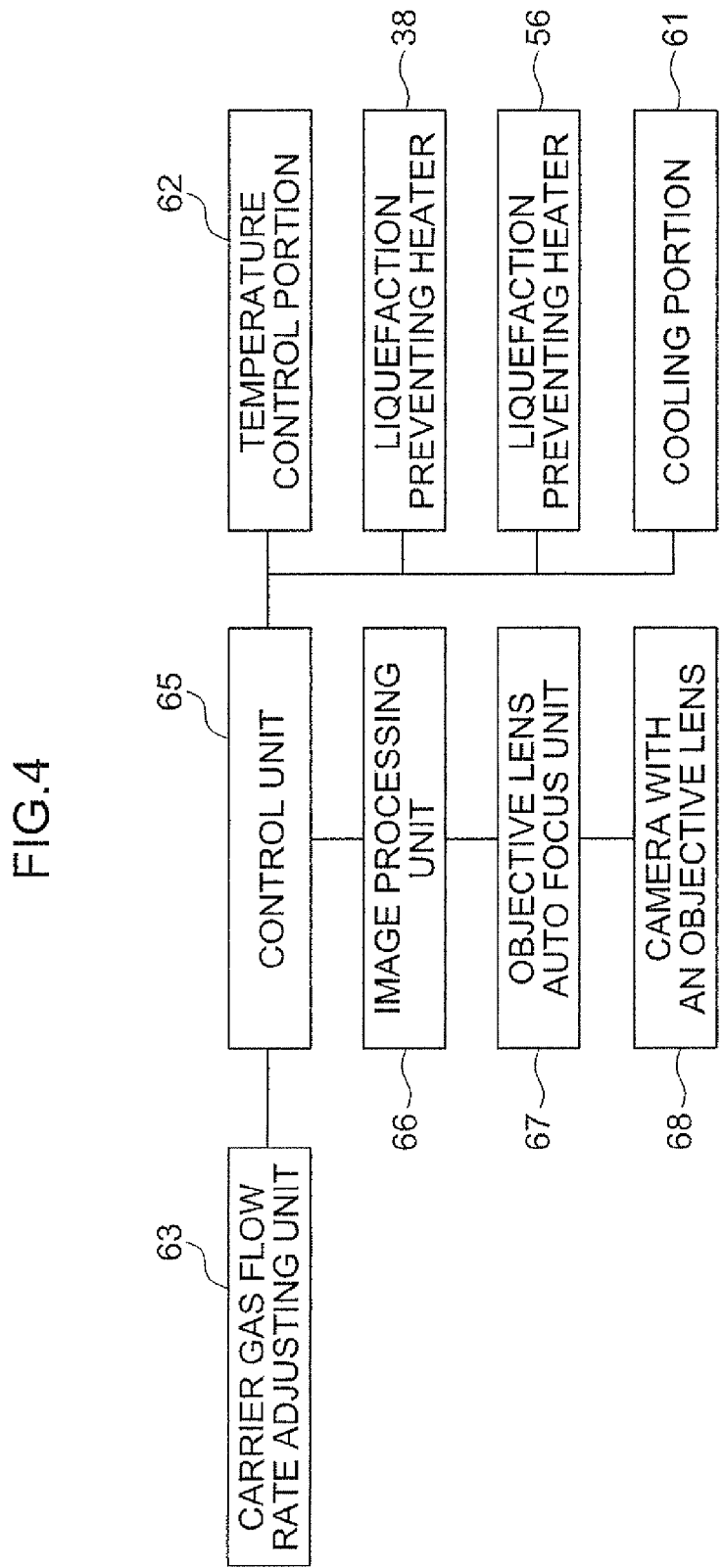
FIG. 4 is a functional block diagram showing a control system of the paste material attaching unit according to the embodiment of the present invention.
Figure 5:
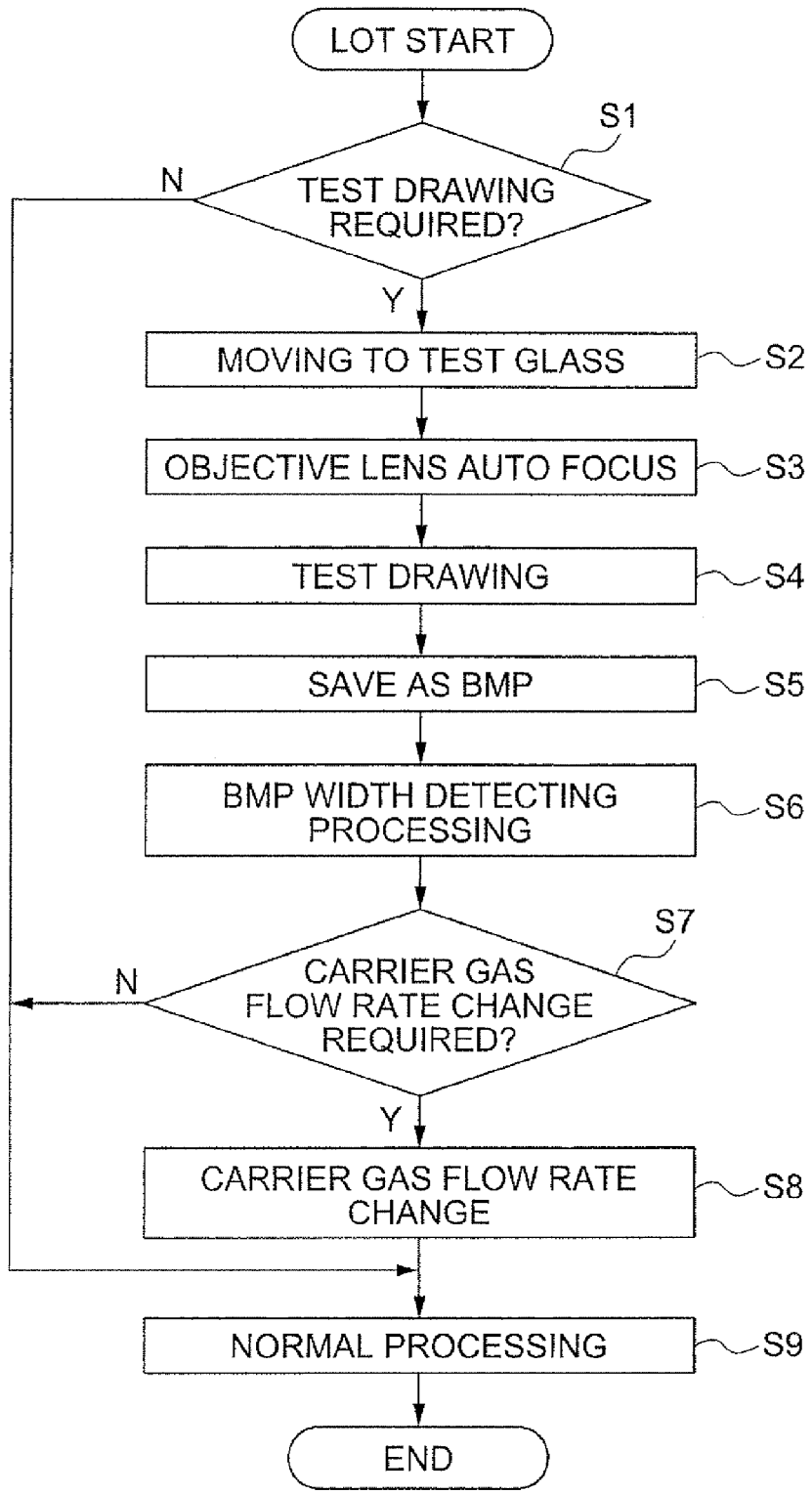
FIG. 5 is a flowchart showing a control function of the wire forming device according to the embodiment of the present invention.

The paste material attaching unit 14 has the atomizing unit 31, a mist stream converting unit 32, and the nozzle 24 as shown in FIG. 3.

The mist stream converting unit 32 converts a mist stream of the paste material atomized by the atomizing unit 31 so that the stream diameter may be a predetermined stream diameter and so that the mist stream may be rotated in a spiral, and the mist stream converted in this manner is adapted to be jetted from the nozzle 24. The nozzle 24 sprays the paste material atomized in the atomizing unit 31 on the insulating substrate 12. As for the mist stream converting unit 32 and the nozzle 24, existing units can be used.

The atomizing unit 31 is a unit for atomizing the paste material. The atomizing unit 31 has an atomizing portion 34, a medium supplying portion 35, and a mixing ratio adjusting unit 36.

The atomizing portion 34 is a unit for atomizing a paste solvent, taking it into a mixed gas from the medium supplying portion 35, and making a mist stream. The atomizing portion 34 is connected to the mist stream converting unit 32 via a communicating tube 37 and supplies the mist stream converting unit 32 with the mist stream of the atomized paste solvent. The communicating tube 37 is provided with a liquefaction preventing heater 38 that prevents an inside thereof from being cooled. The liquefaction preventing heater 38 prevents an after-mentioned medium 53 in the atomized mist stream that is being carried from being liquefied.

The atomizing portion 34 has a constant-temperature bath 41 containing a constant-temperature liquid 40 that is constant-temperature water at a predetermined temperature such as purified water, and in the constant-temperature liquid 40 immersed are a material containing container 43 containing a mixture 42 (paste solvent) of the aforementioned paste material (e.g., metal nano paste) and a medium that dissolves the paste material (diluent such as xylene). The material containing container 43 is installed, e.g., in an inclined manner, and an ultrasonic generating unit 44 is provided in the vicinity of a lowermost position of the material containing container 43 in the constant-temperature bath 41. The ultrasonic generating unit 44 is adapted to supply the mixture 42 with energy for atomization via the constant-temperature liquid 40 and the material containing container 43 by ultrasonic oscillation thereof to atomize the mixture 42. In other words, a process for mist generation is irradiating the mixture 42 as a paste solvent with ultrasonic via the constant-temperature liquid 40 by the ultrasonic generating unit 44 and inducing atomization with use of the energy of the ultrasonic. The constant-temperature liquid 40 functions as a medium for transmitting ultrasonic oscillation and a medium for heating the material.

The upper opening of the material containing container 43 is adapted to be covered with a lid 45. The lid 45 has a fluid inlet 46 and a fluid outlet 47. In the fluid outlet 47, the internal side of the material containing container 43 is connected to an inner tube 48 while the external side of the material containing container 43 is connected to the communicating tube 37 connected to the mist stream converting unit 32. In the fluid inlet 46, the external side of the material containing container 43 is connected to a communicating tube 50 connected to the medium supplying portion 35 while the internal side of the material containing container 43 is connected to a discharge opening 51.

Thus, a mixed gas (mix gas) of a carrier gas and a solvent supplied from the medium supplying portion 35 is introduced from the fluid inlet 46 to the inside of the material containing container 43, introduced to the inside of the inner tube 48, and supplied to the side of the mist stream converting unit 32 sequentially via the inner tube 48, the fluid outlet 47, and the communicating tube 37. At this time, a gas of the mixture 42 atomized by the ultrasonic oscillating energy is taken into this stream, introduced from an opening at the lowermost end of the inner tube 48 to the inside of the inner tube 48, and supplied to the side of the mist stream converting unit 32 sequentially via the inner tube 48, the fluid outlet 47, and the communicating tube 37.

The medium supplying portion 35 is a unit for mixing a gas obtained by atomizing (vaporizing) the medium 53 with a carrier gas (e.g., a nitrogen gas) that is an inert gas and supplying it to the atomizing portion 34. The medium supplying portion 35 is connected via a communicating tube 54 to a carrier gas source 55 and is connected via the communicating tube 50 to the atomizing portion 34. The medium supplying portion 35 mixes a carrier gas supplied from the carrier gas source 55 with a gas obtained by atomizing (vaporizing) the medium 53 and supplies it to the atomizing portion 34 (supplies the medium 53).

The communicating tube 50 is provided with a liquefaction preventing heater 56 that prevents an inside thereof from being cooled. The liquefaction preventing heater 56 prevents the medium 53 in the atomized mixed gas that is being carried from being liquefied.

The mixing ratio adjusting unit 36 is a unit for adjusting a mixing ratio of the aforementioned mist stream. The mixing ratio adjusting unit 36 includes a cooling portion 61, a temperature control portion 62, and a carrier gas flow rate adjusting unit 63.

The cooling portion 61 is a unit for cooling and partially liquefying the mist stream to be supplied from the atomizing portion 34 via the mist stream converting unit 32 to the nozzle 24 to adjust the mixing ratio of the mist stream. The cooling portion 61 is provided at the communicating tube 37 connecting the atomizing portion 34 to the mist stream converting unit 32. The cooling portion 61 is constituted, e.g., by a Peltier element provided in the vicinity of the atomizing portion 34 in the communicating tube 37. As for the cooling portion 61, an existing cooling unit can be used. With this cooling portion 61, the mist stream flowing in the communicating tube 37 from the atomizing portion 34 is cooled and partially liquefied to adjust the mixing ratio of the mist stream.

The temperature control portion 62 is a unit for controlling the temperature of the medium supplying portion 35. The temperature control portion 62 keeps the temperature of the medium supplying portion 35 constant and keeps the medium supplying amount constant. The temperature control portion 62 also changes the temperature of the medium supplying portion 35 in accordance with changes in mixing ratio of the mist stream in the atomizing portion 34 to change the medium supplying amount and eventually adjusts the mixing ratio of the mist stream to be supplied from the atomizing portion 34 via the mist stream converting unit 32 to the nozzle 24. The temperature control portion 62 is configured to include a heating means (not shown) such as a heater and a temperature sensor (not shown) surrounding the medium supplying portion 35. Thus, by detecting the temperature by the temperature sensor and regulating the temperature by the heating means to keep it constant, the carrier gas concentration is constant at all times, the medium supplying portion 35 is not influenced by changes in outside temperature if any, and the medium supplying amount to be supplied to the atomizing portion 34 is constant, which enables life extension of the atomizing portion 34. Also, by changing the temperature of the medium supplying portion 35, the medium supplying amount can be changed to deal with changes in mixing ratio of the mist stream.

The carrier gas flow rate adjusting unit 63 is a unit for adjusting a mixing ratio of a gas obtained by atomizing the medium 53 and a carrier gas by adjusting a flow rate of the carrier gas to be supplied to the medium supplying portion 35. The carrier gas flow rate adjusting unit 63 is provided on the outflow side of the carrier gas source 55. As for the carrier gas flow rate adjusting unit 63, an existing unit such as an opening and closing unit that can adjust the degree of opening of a valve can be used.

The cooling portion 61, the temperature control portion 62, and the carrier gas flow rate adjusting unit 63 are controlled automatically. This automatic control configuration is shown in FIG. 4. A control unit 65 in the figure controls the entirety of the wire forming device 11. The control unit 65 also controls the mixing ratio adjusting unit 36 based on a flowchart in FIG. 5. That is, when the line width of a wire does not reach a predetermined line width, the control unit 65 controls the mixing ratio adjusting unit 36 to adjust a mixing ratio of the mist stream.

To the control unit 65 connected are the cooling portion 61, the temperature control portion 62, the carrier gas flow rate adjusting unit 63, the liquefaction preventing heater 38, and the liquefaction preventing heater 56 respectively. To the control unit 65 also connected is an image processing unit 66 comparing an image of a line width of a formed wire with a preset predetermined line width. To the image processing unit 66 connected is an objective lens auto focus unit 67 for focusing the wiring pattern 23 on the insulating substrate 12. To the objective lens auto focus unit 67 connected is a camera 68 with an objective lens imaging the wiring pattern 23. As for the image processing unit 66, the objective lens auto focus unit 67, and the camera 68 with an objective lens, existing units can be used.

The wire forming device configured as above acts in the following manner. This will be described based on the flowchart in FIG. 5.

First, whether or not test drawing is required is determined (step S1). In a case where it is determined that no test drawing is required, the procedure goes to step S9, and normal processing is performed. That is, in the atomizing unit 31, a carrier gas supplied from the carrier gas source 55 is introduced into the medium supplying portion 35, and a gas obtained by atomizing the medium 53 and the carrier gas are mixed in this medium supplying portion 35. The mixed gas of the gas obtained by atomizing the medium 53 with the carrier gas is supplied to the atomizing portion 34. In the communicating tube 50, the mixed gas is heated by the liquefaction preventing heater 56 to be prevented from being liquefied.

The mixed gas supplied from the medium supplying portion 35 to the atomizing portion 34 is introduced from the fluid inlet 46 to the inside of the material containing container 43, and introduced from the opening at the lowermost end of the inner tube 48 to the inside of the inner tube 48. The mixture 42 is taken into this mixed gas to become a mist stream, and the mist stream is supplied to the side of the mist stream converting unit 32. In the communicating tube 37, the mixed gas is heated by the liquefaction preventing heater 38 to be prevented from being liquefied.

Meanwhile, in the zapping processing unit 13, a laser light is irradiated on the surface of the insulating substrate 12. Oxides remaining at a part irradiated with the laser light are removed by the zapping processing with the laser. Thereafter, the mist stream is jetted from the nozzle 24 and sprayed toward the surface of the insulating substrate 12.

Subsequently, a CW laser light is irradiated by the sintering processing unit 15 for post-processing.

On the other hand, in a case where it is determined that test drawing is required at step S1, the wire forming device 11 is moved to a test glass (step S2), focusing is performed by the objective lens auto focus unit 67 (step S3), and a test line is drawn and is imaged by the camera 68 with an objective lens (step S4).

Subsequently, the image is saved as a BMP (step S5), and a BMP width is detected by image processing (step S6) and is compared with a preset predetermined line width.

Subsequently, whether or not a carrier gas flow rate change is required is determined (step S7). That is, in a case where the imaged line width is smaller than the preset predetermined line width, the carrier gas flow rate adjusting unit 63 is controlled to cause the carrier gas flow rate to be increased (step S8). At this time, the degree of increase of the carrier gas flow rate is adjusted in accordance with the degree of narrowness of the imaged line width with respect to the predetermined line width. Also, the cooling portion 61 and the temperature control portion 62 are operated as needed. That is, together with the carrier gas flow rate adjusting unit 63 or instead of the carrier gas flow rate adjusting unit 63, either or both the cooling portion 61 or/and the temperature control portion 62 is/are controlled. In the cooling portion 61, the mist stream is cooled to heighten the mixing ratio. In the temperature control portion 62, a temperature to heat the medium supplying portion 35 is controlled to increase the supply amount of the mist stream from the nozzle 24. These are finely adjusted to modify the line width of the wiring pattern 23 to the set value.

Subsequently, the procedure goes to normal processing (step S9).

On the other hand, in a case where the imaged line width is not smaller than the predetermined line width, the procedure goes to normal processing (step S9).

In this manner, a stable wire can be formed continuously over a long period.

Although conventional continuous operating time is several hours, using the above system enables a one-month continuous operation with adjustment of application parameters once to twice a day. This can extend a maintenance cycle and maintain a favorable state of the device for a long period, which reduces a running cost.

MODIFICATION EXAMPLES

In the above embodiment, although all of the cooling portion 61, the temperature control portion 62, and the carrier gas flow rate adjusting unit 63 are provided, only one or two of them may be provided. In this case as well, similar effects to those in the above embodiment can be exerted.

Also, the present invention can be applied not only to a device using a metal nano paste but also to various mist jet systems.

Also, the configurations of the atomizing portion 34 and the medium supplying portion 35 vary, and any existing unit can be used.

The invention claimed is:

1. A wire forming device for applying a paste material on an insulating substrate to form a wiring pattern, the wire forming device comprising:
   a paste material application unit which includes an atomizing unit atomizing the paste material and a nozzle which sprays the atomized paste material onto the insulating substrate to form the wiring pattern, and
   wherein the atomizing unit includes:
      a medium supplying portion which mixes a medium with a carrier gas to form a mixed gas;
      an atomizing portion which holds the paste material and brings the mixed gas into contact with the paste material to atomize the paste material, thereby making a mist stream of the mixed gas and the paste material as the atomized paste material fed to the nozzle; and
   a mixing ratio adjusting unit adjusting a mixing ratio of the paste material to the mixed gas in the mist stream.

2. The wire forming according to claim 1, wherein the mixing ratio adjusting unit comprises a cooling portion cooling and partially liquefying the mist stream to be supplied from the atomizing portion to the nozzle to adjust the mixing ratio in the mist stream.

3. The wire forming according to claim 1, wherein the mixing ratio adjusting unit comprises a temperature control portion controlling a temperature of the medium supplying portion to keep the temperature constant in a first mode and, in a second mode, changing the temperature of the medium supplying portion, in accordance with changes in the mixing ratio in the mist stream, to change the amount of medium in the mixed gas.

4. The wire forming according to claim 1, wherein the mixing ratio adjusting unit comprises a carrier gas flow rate adjusting unit adjusting the mixing ratio of the medium and the carrier gas in the mixed gas by adjusting a flow rate of the carrier gas to be supplied to the medium supplying portion.

5. The wire forming according to claim 4, wherein the mixing ratio adjusting unit further comprises:
   a cooling portion cooling and partially liquefying the mist stream to be supplied from the atomizing portion to the nozzle to adjust the mixing ratio in the mist stream; and
   a temperature control portion controlling a temperature of the medium supplying portion to change the temperature of the medium supplying portion, in accordance with changes in the mixing ratio in the mist stream, to change the amount of medium in the mixed gas.

6. The wire forming device according to claim 1, further comprising:
   an image processing unit imaging a width of a formed wire and comparing it with a predetermined line width; and
   a control unit controlling the mixing ratio adjusting unit to adjust the mixing ratio in the mist stream when the line width of the wire imaged by the image processing unit is less than the predetermined line width.

7. The wire forming device according to claim 1, further comprising:
   a sintering unit which irradiates and sinters the paste material in the wiring pattern to form the wire.

* * * * *